United States Patent [19]

Woodard

[11] Patent Number: 4,724,420
[45] Date of Patent: Feb. 9, 1988

[54] METHOD AND APPARATUS FOR QUASI-ANALOG RECONSTRUCTIONS OF AMPLITUDE AND FREQUENCY VARYING ANALOG INPUT SIGNALS

[75] Inventor: George W. Woodard, Starnberg, Fed. Rep. of Germany

[73] Assignee: Varian Associates, Inc., Palo Alto, Calif.

[21] Appl. No.: 811,070

[22] Filed: Dec. 19, 1985

[51] Int. Cl.[4] .......................................... H03M 1/68
[52] U.S. Cl. ........................ 340/347 DA; 340/347 M; 340/347 AD
[58] Field of Search ............... 340/347 SH, 347 DA, 340/347 M; 328/151; 307/353; 358/138

[56] References Cited

U.S. PATENT DOCUMENTS

| | | | |
|---|---|---|---|
| 3,044,007 | 7/1962 | Akers | 323/281 |
| 3,217,147 | 11/1965 | Chapman, Jr. | 340/347 M X |
| 3,305,855 | 2/1967 | Kaneko | 340/347 R |
| 3,576,561 | 4/1971 | Dureau | 340/347 DA |
| 3,581,076 | 5/1971 | Granberg et al. | |
| 3,603,971 | 9/1971 | Woschetsky et al. | 340/347 DA |
| 3,723,855 | 3/1973 | Schuleschke | 323/353 |
| 3,877,021 | 4/1975 | Raamot | 340/347 DA |
| 3,892,977 | 7/1975 | Bierly | 307/77 |
| 4,121,205 | 10/1978 | Iga et al. | 340/347 DA |
| 4,160,244 | 7/1979 | Solomon et al. | 340/347 DA |

OTHER PUBLICATIONS

The Engineering Staff of Analog Devices, Inc., Analog-Digital Conversion Handbook, 6/1972, pp. I-53 to I-57, Supplemental to the Citation of Paper No. 3.
The Engineering Staff of Analog Devices, Inc., Analog-Digital Conversion Handbook, 6/1972, pp. I-84 to I-87; II-32 to II-41.
Schmid, Electronic Analog/Digital Conversions, 1970, Van Nostrand Reinhold Co., pp. 32-37.

Primary Examiner—T. J. Sloyan
Attorney, Agent, or Firm—Nolte, Nolte and Hunter

[57] ABSTRACT

A high level, staircase type of quasi-analog reconstruction of an analog input signal, such as an audio signal, initially involves a conventional derivation of a PCM signal from the analog input signal. The binary bits of each PCM codeword are considered as being C in number, of which an A number are major bits and a B number are minor bits. The A number of bits are converted to ($2^A$-1) discrete decimal data bits, each of which controls the switching to and from a series voltage summation line of a discrete voltage $V_c$, where $V_c=$ $$V_c = \frac{V_{max}(2^B)}{2^C-1}$$

and $V_{max}$ is substantially the peak kilovolt amplitude to be provided in the reconstructed signal. Individual ones of the B bits directly control the individual switching to and from the summation line of discrete voltages of unequal magnitudes declining in one-half voltage increments from $V_c/2$ to $V_c/2^B$. Alternatively, individual bits of N more significant bits of the B bits directly control the individual switching to and from the summation line of discrete voltages of unequal magnitudes declining in one-half voltage increments from $V_c/2$ to $V_c/2^N$, while the remaining (B-N) bits are converted, in combination, to an analog control voltage which drives a step voltage follower whose output is permanently connected in series with the summation line to add thereto a step voltage in the range of from $V_c/2^{N+1}$ to $V_c/2^B$ where the step voltages decline in one-half voltage increments.

2 Claims, 3 Drawing Figures

METHOD AND APPARATUS FOR QUASI-ANALOG RECONSTRUCTIONS OF AMPLITUDE AND FREQUENCY VARYING ANALOG INPUT SIGNALS

FIELD OF THE INVENTION

This invention relates to methods and apparatus for producing practical high level quasi-analog reconstructions of original analog signals of continuously varying amplitude and frequency.

BACKGROUND OF THE INVENTION

Quasi-analog reconstructions of original amplitude and frequency varying analog signals have been provided heretofore in communication systems by sampling, quantizing and encoding an audio input signal into digital signals and using the binary bits of the digital signal of each sampling period to switch discrete voltages supplied from respective power sources into or out of a series voltage summation output line. The output voltages thus produced in successive sampling periods provide the desired quasi-analog reconstruction of the audio input signal.

One such known communication system is the subject of U.S. Pat. No. 3,305,855 issued Feb. 21, 1967 to Hisashi Kaneko. In that system, $2^N$ standard power sources are logically switchably controlled during each sampling period in response to an N-bit codeword, the power sources supplying non-linearly related voltages.

Techniques for switchably interconnecting a plurality of discrete power supplies in series for the purpose of providing predetermined increments in kilovolt power have, moreover, been disclosed in U.S. Pat. No. 3,723,855 issued Mar. 27, 1973 to P. Schuleshke. In addition, a transformer device for converting digital information into a precisely controlled analog voltage, wherein various taps on an autotransformer are configured to provide binary related analog voltages and wherein such voltages are serially combined in response to ten-bit binary control signals, has been disclosed in U.S. Pat. No. 3,603,971 issued Sept. 7, 1971 to W. Woschetsky et al.

Still further, there is a large body of prior art wherein resistive ladder-like networks are switched under control of digital input signals to provide analog output voltages and wherein, for the most part, only one power source is used and the resistive ladders produce stepped voltages which are subsequently logically combined. Illustrative of this body of prior art are: U.S. Pat. No. 4,160,244 issued July 5, 1979 to J. E. Solomon et al; U.S. Pat. No. 3,877,021 issued Apr. 8, 1975 to J. Raamot; and U.S. Pat. No. 3,044,007 issued July 10, 1962 to R. C. Akers.

SUMMARY OF THE INVENTION

An aim of the invention is to provide new and improved techniques leading to the production of a high level quasi-analog reconstruction of an amplitude and frequency varying analog input signal.

Another aim of the invention, consonant with the foregoing aim, is to produce the reconstructed signal in stepwise fashion and with optimum resolution resulting from a unique utilization of a basic PCM signal derived from the analog input signal.

Another aim of the invention is to process a basic PCM signal into discrete decimal and binary steps leading to a practical reconstruction of an original analog signal in small discrete steps, the reconstructed analog signal being advantageously suitable for a number of purposes including the amplitude modulating of a radio frequency amplifier stage in order to obtain a low distortion, high efficiency AM signal.

According to one aspect of the invention, there is provided a method of producing a high level quasi-analog reconstruction of an amplitude and frequency varying analog input signal, which method comprises the steps of: providing proportional pulse coded discrete time samples of the analog input signal, each coded sample having a C number of binary bits consisting of an A number of major bits and a B number of minor bits to satisfy the equation $A+B=C$, the sampling frequency being at least twice the highest frequency in the input signal; producing, in dependence upon the binary value of the A number of major bits of each pulse coded sample, $(2^A-1)$ discrete voltages of given polarity and of equal magnitude $V_c$, where $$V_c = \frac{V_{max}(2^B)}{2^C-1}$$

and $V_{max}$ is substantially the peak voltage amplitude to be provided in the quasi-analog reconstruction; producing, in dependence upon the binary value of the B number of minor bits of each pulse coded sample, B discrete voltages of the given polarity and of unequal magnitude declining in one-half voltage increments from $V_c/2$ to $V_c/2^B$; and additively combining, in each sampling period, all discrete voltages produced in dependence upon the binary value of the A number of major bits and upon the binary value of the B number of minor bits, thereby to produce the quasi-analog reconstruction of the analog input signal.

According to another aspect of the invention, there is provided an apparatus for producing a high level quasi-analog reconstruction of an amplitude and frequency varying analog input signal, which apparatus comprises: pulse code modulator means responsive to the analog input signal for providing proportional pulse coded discrete time samples thereof, each of a C number of binary bits consisting of an A number of major bits and a B number of minor bits to satisfy the equation $A+B=C$, the modulator means employing a sampling frequency at least twice the highest frequency in the input signal; first voltage producing means responsive to the A number of major bits of each pulse coded sample for producing, in dependence upon the binary value of the A number of major bits, $(2^A-1)$ discrete voltages of given polarity and of equal magnitude $V_c$, where $$V_c = \frac{V_{max}(2^B)}{2^C-1}$$

and $V_{max}$ is substantially the peak voltage amplitude to be provided in the quasi-analog reconstruction; second voltage producing means responsive to the B number of minor bits of each pulse coded sample for producing, in dependence upon the binary value of the B number of minor bits, B discrete voltages of the given polarity and of unequal magnitude declining in one-half voltage increments from $V_c/2$ to $V_c/2^B$; and voltage summing means for additively combining in each sampling period all discrete voltages produced in response to the A number of major bits and to the B number of minor bits, thereby to produce the quasi-analog reconstruction of the analog input signal.

BRIEF DESCRIPTION OF THE DRAWINGS

In order that the invention may be more fully understood, it will now be described in conjunction with the following drawings, in which.

Like reference numerals throughout the various figures of the drawings are intended to designate the same elements.

DETAILED DESCRIPTION OF THE INVENTION

Figure 1:
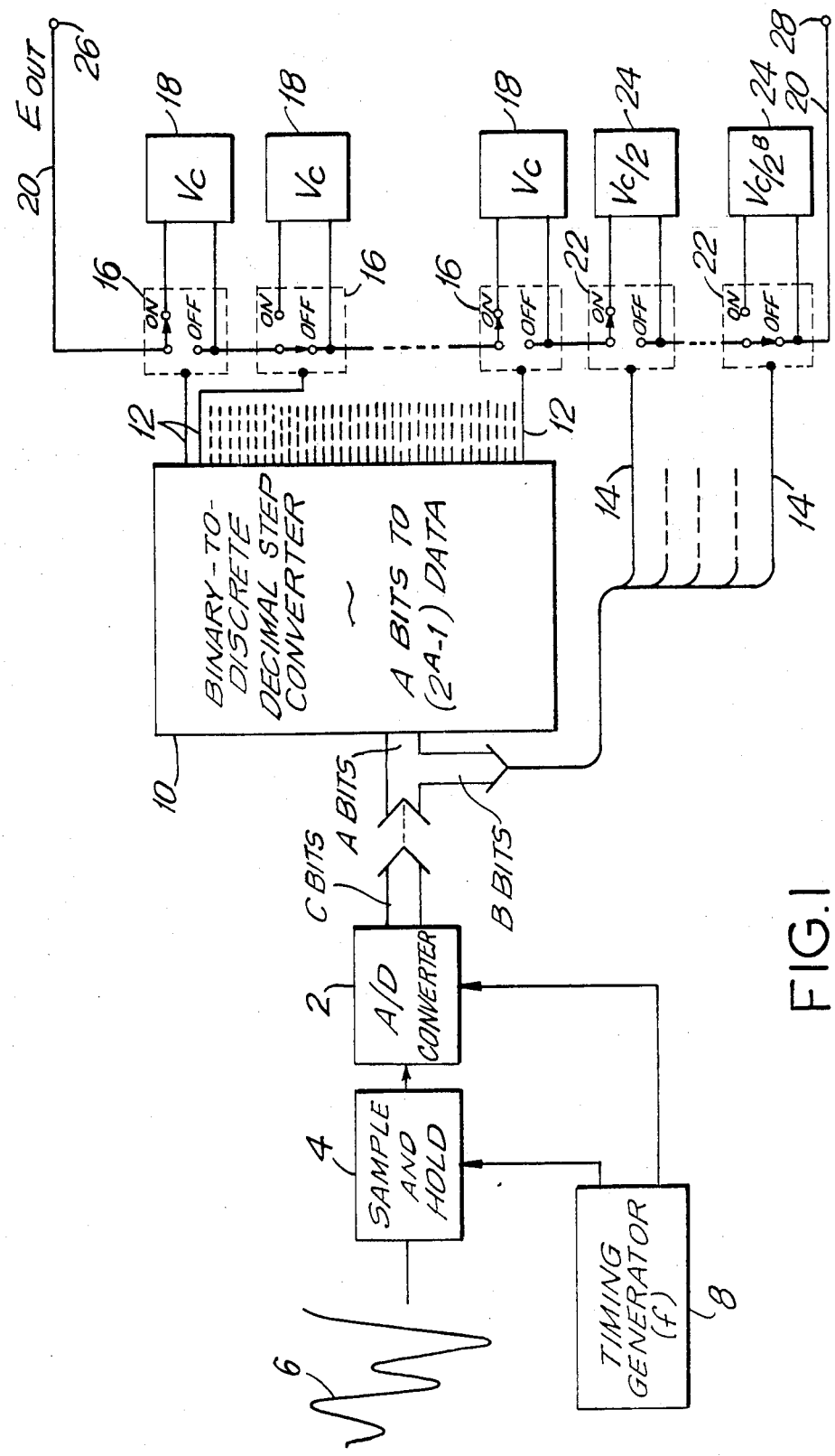
FIG. 1 is a block diagram of an apparatus embodying the invention.

Referring to FIG. 1, a basic pulse code modulation signal having a plurality of C parallel binary bits is generated by an analog-to-digital converter 2 which, according to well-known pulse code modulation techniques, receives its analog input from a sample and hold circuit 4 to which an analog input signal 6 of continuously-varying amplitude and frequency is fed, this signal ultimately to undergo a quasi-analog reconstruction. The sampling rate is determined in conventional manner by a timing generator 8 which supplies timing pulses to the sample and hold circuit 4 and to the analog-to-digital converter 2, the rate being at least twice the highest frequency in the analog input signal 6. Thus, the instanteous magnitudes of the time-varying amplitude of the analog input signal 6 are measured at a given sampling rate, and successive proportional responses in pulse code form are supplied by the analog-to-digital converter 2, each codeword having a length of C parallel binary bits.

The first or most significant group of A bits of the C bits is channeled to the input of a binary-to-discrete decimal step converter 10 which converts the A bits into a set of $(2^A-1)$ parallel data appearing on respective control lines 12 at the output of the converter 10. Accordingly, the converter 10 has a plurality of $(2^A-1)$ control lines 12, each receiving a respective one of the $(2^A-1)$ data outputted by the converter 10. The next or least significant group of B bits of the C bits remains in accordance with the essential relation $A+B=C$, and is channeled to respective ones of a plurality of B control lines 14.

In FIG. 1, the $(2^A-1)$ parallel data and the B bits are utilized to switchably interconnect, in series, D.C. voltage outputs of respectively associated discrete voltage sources such that a resultant summation output $E_{out}$ is produced which is an analog voltage corresponding in magnitude to the value of the C bit codeword. To this end, a plurality of $(2^A-1)$ switches 16 are respectively controlled by the control lines 12, each switch 16 being connected to a respective voltage source 18 of $V_c$ volts D.C., where $$V_c = \frac{V_{max}(2^B)}{2^C-1}$$

and $V_{max}$ is substantially the peak voltage amplitude to be provided in the quasi-analog reconstruction of the analog input signal 6. The control is such that all those switches 16 which are switched ON by their respective control lines 12 serially interconnect into a voltage summation line 20, the $V_c$ volt outputs of the voltage sources 18 connected to those ON switches. The switches 16 which are switched OFF by their respective control lines isolate the $V_c$ volt outputs of the voltage sources 18 connected to the OFF switches from the serially interconnected $V_c$ volt outputs and maintain the serial continuity of the summation line 20 where the isolated outputs would otherwise be serially interconnected into the line. Similarly, a plurality of B ON-OFF switches 22, which may be identical to the switches 16, are respectively controlled by the control lines 14, each switch 22 being connected to a respective voltage source 24. However, unlike the voltage sources 18, the voltage sources 24 respectively supply D.C. voltages of unequal magnitudes declining in one-half voltage increments from $Vc/2$ to $Vc/2^B$, according to the significance of the bits on the respective control lines 14. Thus, all those switches 22 which are switched ON by their respective control lines 14 serially interconnect into the voltage summation line 20 particular ones of the unequal voltages within the range of from $Vc/2$ to $Vc/2^B$. The switches 22 which are switched OFF isolate the remaining unequal voltages from the summation line 20 and maintain the line's serial continuity where these remaining voltages would otherwise be serially interconnected into the line.

Thus, in each sampling period, the voltages serially interconnected in the summation line 20 additively combine with one another to produce an output voltage $E_{out}$ across the end terminals 26, 28 of the line 20, each output voltage $E_{out}$ being a discrete voltage step in a staircase-type of quasi-analog reproduction of the analog input signal 6. By this special combination of binary-to-discrete decimal step conversion and straight binary addition in FIG. 1, any one of $(2^c-1)$ discrete voltage steps can be generated in each sampling period with the use of only $(2^A-1)+B$ control lines where: $A+B=C$.

For example, if $A=7$ and $B=5$, any one of 4095 different values of $E_{out}$ can be generated in each sampling period with the use of only 132 control lines. By the same token, if $A=7$ and $B=9$, any one of 65,535 different values of $E_{out}$ are possible in each sampling period with the use of only 136 control lines.

Reverting to the first example in which $C=12$ bits, $A=7$ bits and $B=5$ bits, should each $V_c$ output of the voltage sources 18 in FIG. 1 be 300 volts and should all such voltage outputs be serially interconnected by the switches 16, it will be appreciated that the output capability of all the voltage sources 18 is $\Sigma V_c = 300 \times 127 = 38,100$ volts. The outputs of the five voltage sources 24 decrease in value in one-half voltage increments, i.e., 150, 75, 37.5, 18.75 and 9.375 volts and when such outputs are added to $\Sigma V_c$, there is achieved a total output capability of 38,390.625 volts with a 9.375 volt resolution, or a resolution of 1 part in 4095. In this example, it follows that quasi-analog reconstructions of pure low frequency analog sinusoidal input signals can be carried out with less than 0.02% theoretical THD (total harmonic distortion) at full output, i.e., approximately 2047 steps per half-wave. See *Modulation, Noise and Spectral Analyses*, Phillip F. Panter, McGraw-Hill, 1965, p. 640. The theoretical THD at 10% output (approximately 205 steps per half-wave) is less than 0.2%. Applied to amplitude modulation of a radio frequency carrier wave, full power supply output is coincident with full positive envelope voltage modulation of the AM signal.

Figure 2:
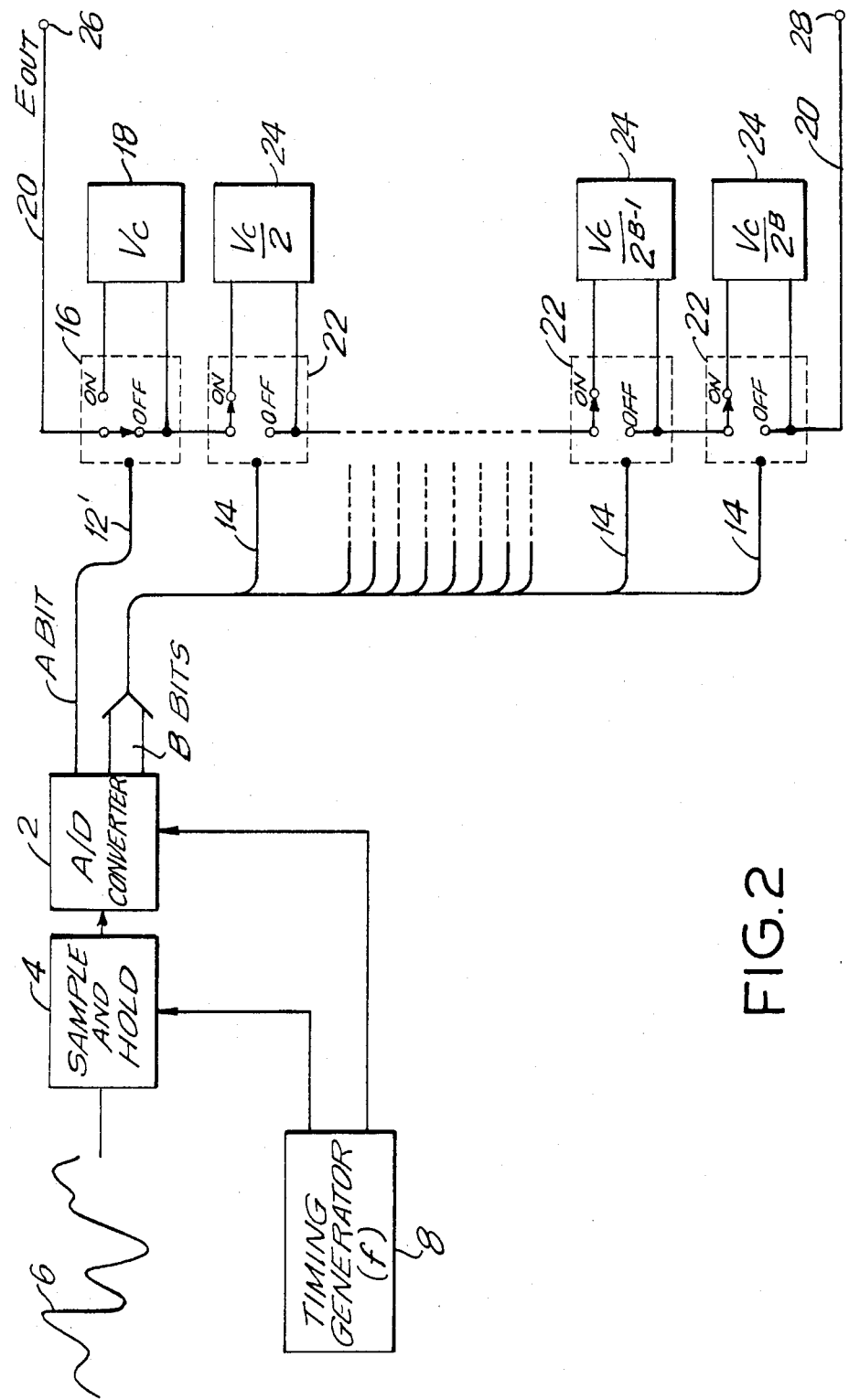
FIG. 2 is a block diagram of an alternative apparatus embodying the invention.

Referring now to FIG. 2, the embodiment therein depicted differs from that of FIG. 1 by virtue of A being equal to 1, so that $B=C-1$ and $(2^A-1)=1$. Thus, in FIG. 2, the use of the binary-to-discrete decimal step converter 10 of FIG. 1 is obviated, as only one voltage source 18 of $V_c$ volts D.C., one switch 16 connected thereto and one switch control line 12 are needed. Therefore, the single major bit utilized in the case of $A=1$ is shown in FIG. 2 as being directly connected via a single control line 12' in controlling relation to a single switch 16 associated with a single $V_c$ voltage source 18.

In FIG. 2, the plurality of B ON-OFF switches 22 are still respectively controlled by the control lines 14, and the switches 22 are still respectively connected to voltage sources 24 whose D.C. voltages decline in one-half voltage increments from $Vc/2$ to $Vc/2^B$ according to the significance of the bits on the respective control lines 14. Thus, if it is assumed, for example, that in a $C=12$ bits system, the maximum output voltage $V_{max}=1800$ volts and the maximum switching capability is 900 volts, there would in effect be one discrete decimal data bit (or one control line 12') controlling one ON-OFF switch 16 associated with the voltage source 18, but there would be eleven binary bits (or eleven control lines 14) controlling eleven ON-OFF switches 22 associated with the voltage sources 24, which, in this case, would respectively supply 900 volts plus 450, 225 ... 1.75, 0.88, 0.44 volts yielding a total maximum output of $E_{out}=1799.56$ volts at the terminals 26, 28. As in FIG. 1, any one of $(2^c-1)$ discrete voltage steps can be generated in each sampling period, but this is possible in FIG. 2 with the use of only $B+1=C$ control lines. Thus, with $B+1$ and C both equal to twelve, any one of 4095 different values of $E_{out}$ can be generated in each sampling period with the use of only twelve control lines.

Figure 3:
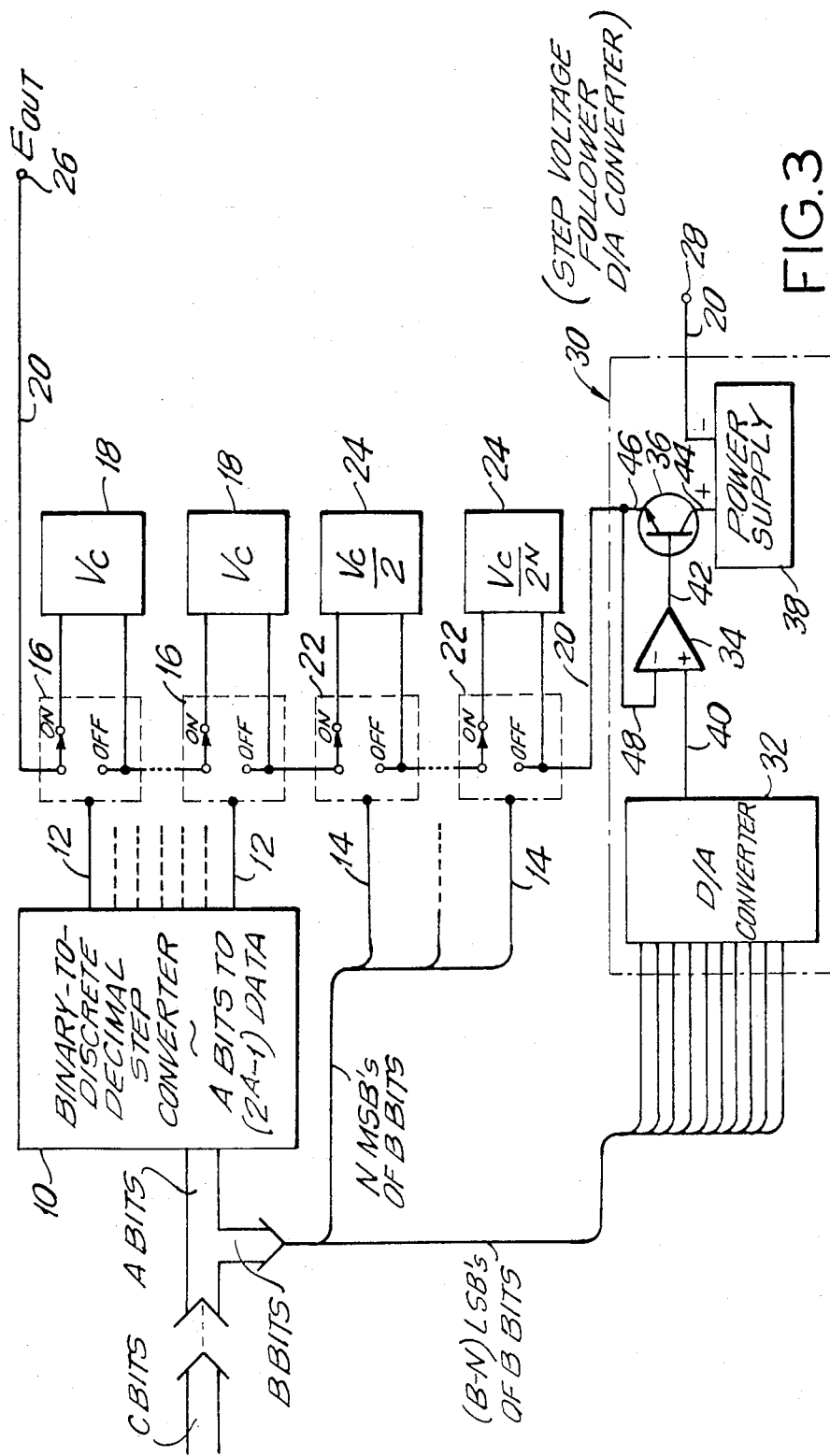
FIG. 3 is a block diagram of another alternative apparatus embodying the invention.

Another technique in accordance with the present invention will now be described in conjunction with FIG. 3 which illustrates a system capable of effectively handling the small voltage steps and distinguished by having no practical restriction on its maximum bit capacity. In some respects, the system of FIG. 3 is similar to that of FIG. 1, particularly in its use of the binary-to-discrete decimal step converter 10 to convert A bits of the C-bit codeword representing each sample taken of the analog input signal 6 (FIG. 1) to $(2^A-1)$ discrete decimal data on control lines 12 associated with the switches 16 and the sources 18 of equal voltages $V_c$. However, the FIG. 3 system differs from the FIG. 1 system by virtue of using the B bits of the C-bit codeword in two groups, one group having a plurality of N most significant bits, the other group having a plurality of (B−N) least significant bits. While the N bits are used in the FIG. 3 system in the same manner as all the B bits are used in the FIG. 1 system, i.e., to control the respective switches 22 associated with voltage sources 24 whose outputs decline in one-half voltage increments starting with an output of $Vc/2$, the (B−N) bits are uniquely handled by being fed to a D/A converter-step voltage follower circuit 30. The circuit 30, in response to $2^{(B-N)}$ possible binary values of the combination of (B−N) bits, is capable of producing $2^{(B-N)}$ analog voltage outputs which decline in one-half voltage increments from $Vc/2^{N+1}$ to $Vc/2^B$ in step with respective decreases in the possible binary values of the (B−N) bit combination.

The converter portion of the circuit 30 is provided by the digital-to-analog converter 32 which is shown in FIG. 3 as receiving (B−N) LSB's of the B bits channelled away from the C bits provided by the analog-to-digital converter 2 (FIG. 1). The step voltage follower portion of the circuit 30 is provided by an operational amplifier 34, a transistor 36 and a power supply 38. The analog voltage output of the converter 32 is fed via a lead 40 to the positive input terminal of the amplifier 34. The signal output of the amplifier 34 is applied via a lead 42 to the base of the transistor 36, the collector of which is connected directly to the power supply 38 via a lead 44 while the output of the transistor 36 is taken from the emitter thereof and applied to the voltage summation line 20 via a lead 46, whereby the transistor functions as an emitter-follower. Negative feedback from the emitter lead 46 to the negative input terminal of the amplifier 34 is conducted by a lead 48. The power supply 38 may provide approximately the same voltage magnitude $Vc/2^N$ provided by that one of the voltage sources 24 which is correlated with the Nth bit of the N MSB's.

As an example of parameters for use in the operation of the FIG. 3 system, let it be assumed that $V_{max} \approx 2400$ volts, $V_c=300$ volts, $C=16$ bits, $A=3$ bits and $N=3$ bits. In this case, it would follow that $B=13$ bits, $(B-N)=10$ bits, $(2^A-1)=7$ bits, $Vc/2=150$ volts, $Vc/2^N=37.5$ volts, $Vc/2^{N+1}=18.75$ volts and $Vc/2^B=0.04$ volt; and that the D/A converter-step voltage follower circuit 30 has the capacity of contributing any one of 1024 different voltages to the voltage summation line 20 with a resolution of 0.04 volt. By merely changing C from 16 bits to 12 bits, it would follow that $B=9$ bits, $(B-N)=6$ bits and $Vc/2^B=0.6$ volt; and that the circuit 30 has the capacity of contributing any one of 64 different voltages to the voltage summation line 20 with a resolution of 0.6 volt.

What is claimed is:

1. In a method for producing a high level quasi-analog reconstruction of an amplitude and frequency varying analog input signal, wherein the analog input signal is quantized to deliver C parallel binary bits representing each quantized value of said analog input signal in pulse code, the improvement comprising:
  (a) carrying out a binary-to-discrete decimal step conversion of A major bits of said C parallel binary bits, said C parallel bits consisting of B minor bits plus said A major bits to satisfy the relation $A+B=C$, for outputting $(2^A-1)$ parallel discrete decimal data bits;
  (b) utilizing said $(2^A-1)$ decimal data bits to respectively supply equal electrical voltages in response thereto, each voltage being of a magnitude $V_c$, where $$V_c = \frac{V_{max}(2^B)}{2^C-1}$$

and $V_{max}$ is substantially the peak voltage to be provided in said high level quasi-analog reconstruction of said analog input signal;
  (c) utilizing N MSB's of said B minor bits to respectively supply electrical voltages which decline in one-half voltage increments from $Vc/2$ to $Vc/2^N$;
  (d) utilizing the combination of the remaining (B−N) LSB's of said B minor bits to supply electrical voltages which decline in one-half voltage increments and which, from the highest to the lowest binary value of said combination of (B−N) LSB's, range from $V_c/2^{N+1}$ to $V_c/2^B$; and (e) additively combining, in each quantization period, all electrical voltages supplied by the utilization of said $(2^A-1)$ decimal data bits and by the utilization of said N MSB's and said (B−N) LSB's of said B minor bits, thereby to produce said quasi-analog reconstruction of said analog input signal.

2. In an apparatus for producing a high level quasi-analog reconstruction of an amplitude and frequency varying analog input signal, including quantizer means having input terminals for receiving the analog input signal and a plurality of C output terminals for respectively delivering C parallel binary bits representing a quantized value of said analog input signal in pulse code, the improvement comprising:

(a) a binary-to-discrete decimal step converter having a plurality of A input terminals for respectively receiving A major bits of said C parallel binary bits, said C parallel binary bits consisting of B minor bits plus said A major bits to satisfy the relation $A+B=C$, said converter having a plurality of $(2^A-1)$ output terminals for respectively outputting $(2^A-1)$ discrete decimal data bits;

(b) a plurality of $(2^A-1)$ discrete power sources connected to said converter output terminals and respectively controlled by said $(2^A-1)$ discrete decimal data bits to respectively supply electrical voltages in response thereto, each voltage being of a magnitude $V_c$ equal for all said $(2^A-1)$ discrete power sources, where $$V_c = \frac{V_{max}(2^B)}{2^C-1}$$

and $V_{max}$ is substantially the peak voltage to be provided in said high level quasi-reconstruction of said analog input signal;

(c) a plurality of other power sources of two kinds, one kind being discrete power sources respectively controlled by N MSB's of said B minor bits to respectively supply electrical voltages which decline in one-half voltage increments from $V_c/2$ to $V_c/2^N$, the second kind being a single power source controlled by the combination of the remaining (B−N) LSB's of said B minor bits to supply electrical voltages which decline in one-half voltage increments and which, from the highest to the lowest binary value of said (B−N) LSB's, range from $V_c/(2^{N+1})$ to $V_c/2^B$; and (d) means connected to all of said power sources for additively combining the electrical voltages controllably supplied by said sources in each quantization period, thereby to produce said quasi-analog reproduction of said analog input signal.

* * * * *